(12) United States Patent
Choi et al.

(10) Patent No.: US 11,751,463 B2
(45) Date of Patent: Sep. 5, 2023

(54) ORGANIC LIGHT EMITTING DISPLAY APPARATUS HAVING A CAMERA

(71) Applicant: LG Display Co., Ltd., Seoul (KR)

(72) Inventors: Jeonghyeon Choi, Paju-si (KR); Sul Lee, Paju-si (KR); Eunil Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 250 days.

(21) Appl. No.: 17/132,561

(22) Filed: Dec. 23, 2020

(65) Prior Publication Data

US 2021/0193758 A1 Jun. 24, 2021

(30) Foreign Application Priority Data

Dec. 24, 2019 (KR) ........................ 10-2019-0173676

(51) Int. Cl.
*H10K 59/65* (2023.01)
*H10K 59/131* (2023.01)

(52) U.S. Cl.
CPC ........... *H10K 59/65* (2023.02); *H10K 59/131* (2023.02)

(58) Field of Classification Search
CPC ............. H01L 27/3234; H01L 27/3276; H01L 27/3248; H01L 27/326; H01L 27/3225;
(Continued)

(56) References Cited

U.S. PATENT DOCUMENTS

2007/0264525 A1* 11/2007 Chiba .................... G03B 13/00
428/690

2012/0007496 A1* 1/2012 Maruyama .......... H01L 51/5203
313/504
(Continued)

FOREIGN PATENT DOCUMENTS

CN 209265332 U 8/2019
CN 110278300 A 9/2019
(Continued)

OTHER PUBLICATIONS

Extended European Search Report dated May 21, 2021, issued in European patent application No. 20212697.5.
(Continued)

*Primary Examiner* — Nduka E Ojeh
*Assistant Examiner* — Laura M Dykes
(74) *Attorney, Agent, or Firm* — Morgan, Lewis & Bockius LLP (57) ABSTRACT

An organic light emitting display apparatus and an electronic device including the same are provided. The organic light emitting display apparatus comprises an organic light emitting display panel including a display area and a non-display area, the display area including a transparent area, a buffer area provided outside the transparent area, and an opaque area provided outside the buffer area, a camera provided in the transparent area in a rear surface of the organic light emitting display panel to photograph a region in a forward direction with respect to the organic light emitting display panel, and a transparent area pixel driving circuit provided in the buffer area to drive a transparent area organic light emitting diode provided in the transparent area. The transparent area organic light emitting diode is connected to the transparent area pixel driving circuit through a transparent area electrode line.

15 Claims, 7 Drawing Sheets

(58) Field of Classification Search
CPC .............. H01L 27/3244; H01L 51/5203; H01L 51/5262; G09G 3/322; G09G 3/3225; H10K 59/65; H10K 59/131; H10K 59/121; H10K 59/123; H10K 59/00; H10K 50/805; H10K 50/85; H10K 59/12
USPC ......................................................... 257/40
See application file for complete search history.

(56) References Cited

U.S. PATENT DOCUMENTS

| | | |
|---|---|---|
| 2018/0358413 A1 | 12/2018 | Lee et al. |
| 2019/0393286 A1 | 12/2019 | Ding et al. |
| 2020/0020953 A1* | 1/2020 | Regula ................ H01M 4/0404 |
| 2020/0052048 A1* | 2/2020 | Kuo ........................ H10K 59/65 |
| 2020/0279895 A1 | 9/2020 | Kuo et al. |
| 2020/0403043 A1 | 12/2020 | Xin et al. |
| 2021/0066409 A1* | 3/2021 | Fan ...................... H01L 27/3234 |
| 2021/0158750 A1 | 5/2021 | Xiang et al. |
| 2021/0408200 A1* | 12/2021 | Zhao ................... H01L 27/3227 |
| 2022/0093682 A1* | 3/2022 | Chang ................. H01L 27/3276 |

FOREIGN PATENT DOCUMENTS

| | | |
|---|---|---|
| CN | 110288945 A | 9/2019 |
| CN | 110504287 A | 11/2019 |
| EP | 4 064 360 A1 | 9/2022 |
| KR | 10-2017-0024182 A | 3/2017 |
| KR | 10-2020-0058891 A | 5/2020 |
| TW | 201939733 A | 10/2019 |
| TW | 201944387 A | 11/2019 |
| WO | 2019/062179 A1 | 4/2019 |

OTHER PUBLICATIONS

Office Action issued by the Tiawanese Patent Office corresponding to Tiawanese Application No. 109145758, dated Sep. 29, 2021.
Office Action (in English) dated Mar. 17, 2023, issued in corresponding European Application No. 20 212 697.5.

* cited by examiner

ORGANIC LIGHT EMITTING DISPLAY APPARATUS HAVING A CAMERA

CROSS-REFERENCE TO RELATED APPLICATIONS

This application claims the benefit of the Korean Patent Application No. 10-2019-0173676 filed on Dec. 24, 2019, which is hereby incorporated by reference as if fully set forth herein.

BACKGROUND

Technical Field

The present disclosure relates to an organic light emitting display apparatus where a camera is mounted in a forward direction with respect to an organic light emitting display panel.

Discussion of the Related Art

As various kinds of applications are provided in electronic devices such as smartphones, users need display apparatuses including a wider display unit.

Moreover, in electronic devices such as smartphones, a camera is mounted in a forward direction with respect to a display panel so that a user photographs its own form while looking at its own form.

In this case, in order to maximally enlarge a width of a display part displaying an image in a display apparatus, a camera may be provided in a display area, displaying an image, of a display panel.

However, in order to prevent a luminance deviation caused by the degradation in each driving transistor, four or more transistors are included in each pixel of an organic light emitting display panel which is a type of display panel. Therefore, even when a portion, corresponding to a camera, of the organic light emitting display panel is implemented as a transparent panel, a transmittance of light is reduced by transistors included in the transparent panel.

Due to this, the amount of light transferred to a camera is reduced, causing the degradation in quality of an image captured by the camera.

SUMMARY

Accordingly, embodiments of the present disclosure are directed to an organic light emitting display apparatus that substantially obviates one or more problems due to limitations and disadvantages of the related art.

An aspect of the present disclosure is directed to providing an organic light emitting display apparatus in which a plurality of pixel driving circuits for driving a plurality of organic light emitting diodes included in a transparent area are provided outside the transparent area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting display apparatus comprises an organic light emitting display panel including a display area and a non-display area, the display area including a transparent area, a buffer area provided outside the transparent area, and an opaque area provided outside the buffer area, a camera provided in the transparent area in a rear surface of the organic light emitting display panel to photograph a region in a forward direction with respect to the organic light emitting display panel, and a transparent area pixel driving circuit provided in the buffer area to drive a transparent area organic light emitting diode provided in the transparent area, wherein the transparent area organic light emitting diode is connected to the transparent area pixel driving circuit through a transparent area electrode line.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1:
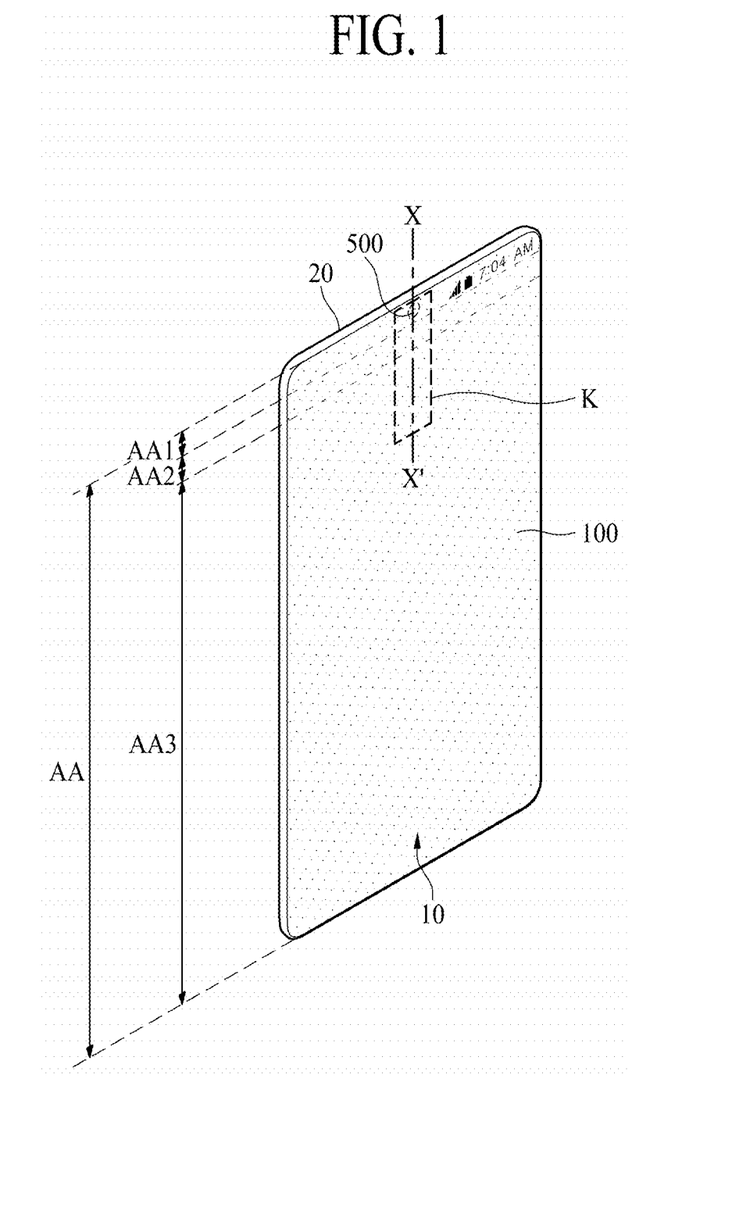
FIG. 1 is an exemplary diagram illustrating an external configuration of an electronic device to which an organic light emitting display apparatus according to an embodiment of the present disclosure is applied.

FIG. 1 is an exemplary diagram illustrating an external configuration of an electronic device to which an organic light emitting display apparatus according to an embodiment of the present disclosure is applied.

The organic light emitting display apparatus according to an embodiment of the present disclosure may configure an electronic device. The electronic device may include, for example, a smartphone, a tablet personal computer (PC), a television (TV), a monitor, etc. In FIG. 1, a smartphone is illustrated as an example of the electronic device. In the following description, an example where the electronic device is a smartphone will be described.

Figure 2:
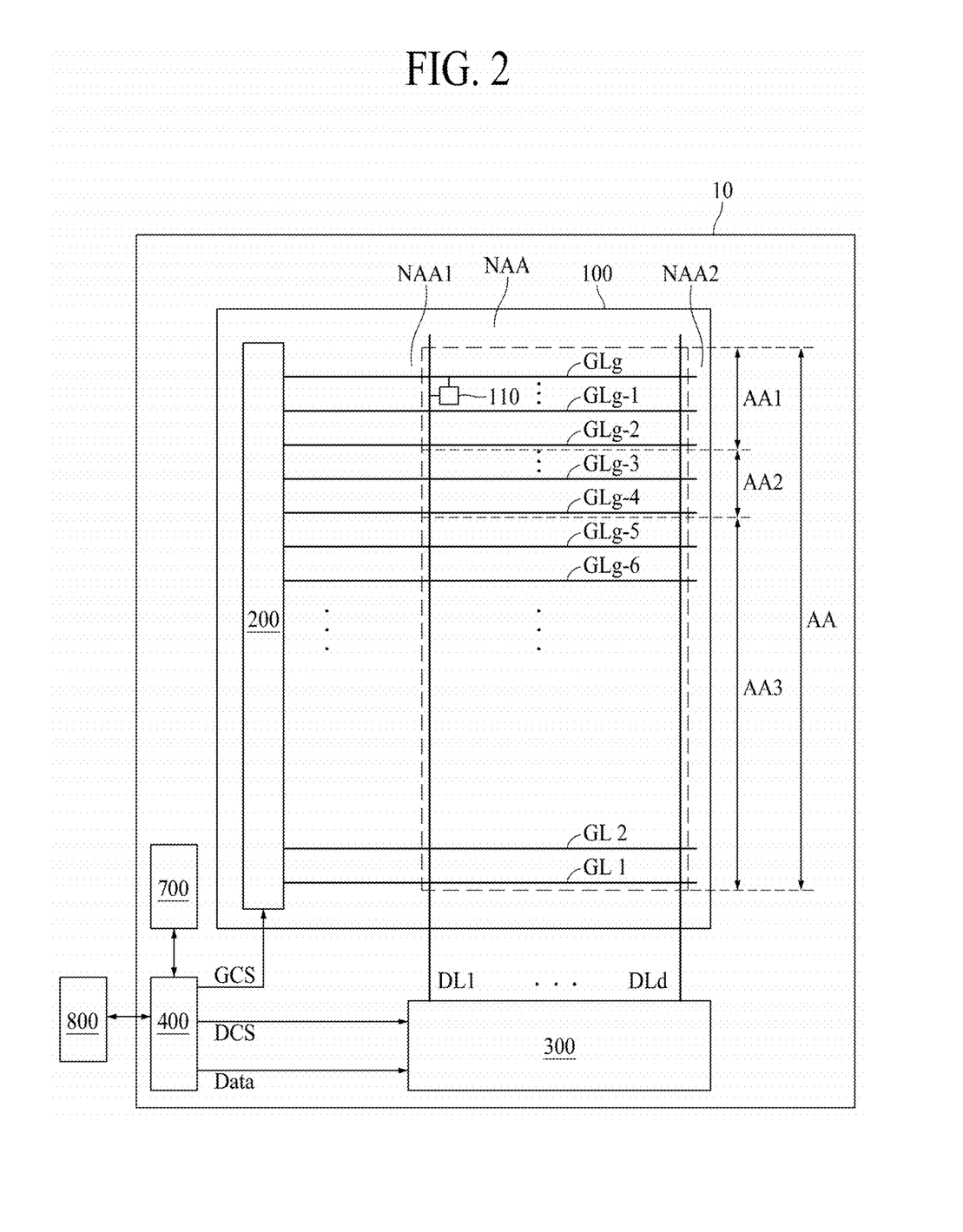
FIG. 2 is an exemplary diagram illustrating an internal configuration of an organic light emitting display apparatus according to an embodiment of the present disclosure.
Figure 3:
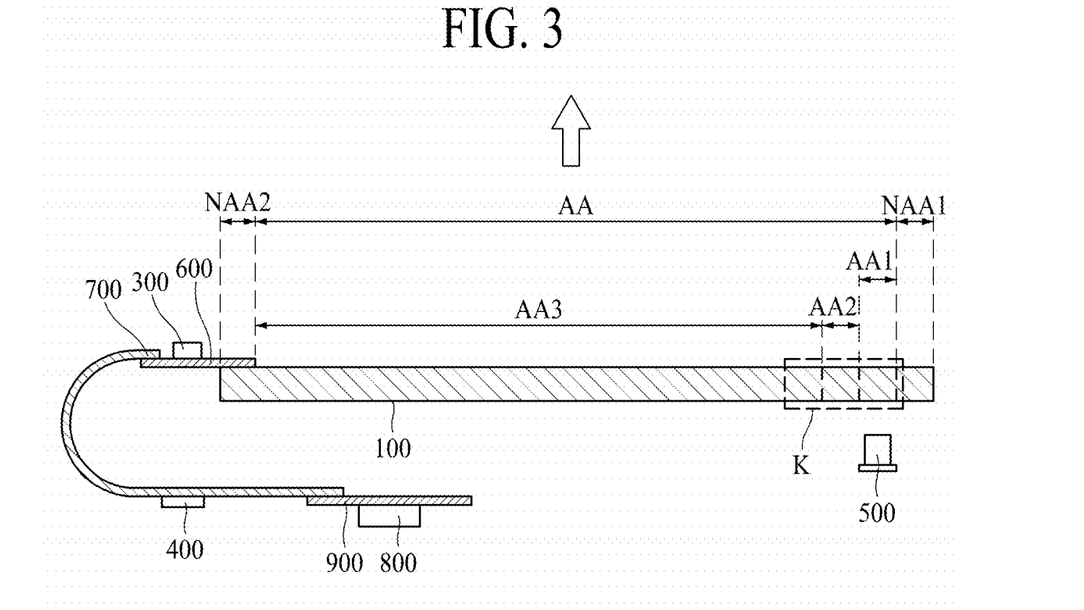
FIG. 3 is an exemplary diagram illustrating an external configuration of an organic light emitting display apparatus according to an embodiment of the present disclosure.
Figure 4:
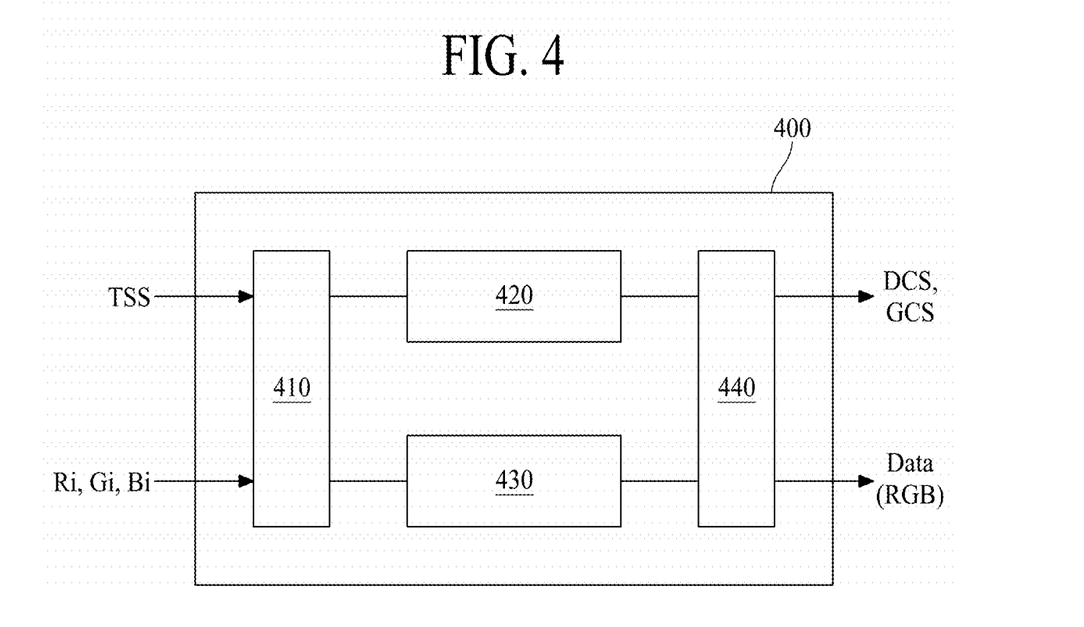
FIG. 4 is an exemplary diagram illustrating a configuration of a controller applied to an organic light emitting display apparatus according to an embodiment of the present disclosure.

FIG. 2 is an exemplary diagram illustrating an internal configuration of an organic light emitting display apparatus according to an embodiment of the present disclosure, FIG. 3 is an exemplary diagram illustrating an external configuration of an organic light emitting display apparatus according to an embodiment of the present disclosure, and FIG. 4 is an exemplary diagram illustrating a configuration of a controller applied to an organic light emitting display apparatus according to an embodiment of the present disclosure.

The electronic device, as illustrated in FIGS. 1 and 2, may include an organic light emitting display apparatus 10 according to the present disclosure and an external case 20 which supports the organic light emitting display apparatus 10.

The organic light emitting display apparatus according to an embodiment of the present disclosure, as illustrated in FIGS. 1 and 2, may include an organic light emitting display panel 100 including a display area AA displaying an image and a non-display area NAA provided outside the display area AA. The display area AA may include a transparent area AA1, a buffer area AA2 provided outside the transparent area AA1, and an opaque area AA3 provided outside the buffer area AA2, a camera 500 which is provided in the transparent area AA1 in a rear surface of the organic light emitting display panel 100 and photographs a region in a forward direction with respect to the organic light emitting display panel 100, a gate driver 200 which sequentially supplies a gate pulse to a plurality of gate lines GL1 to GLg included in the organic light emitting display panel 100, a data driver 300 which supplies data voltages to a plurality of data lines DL1 to DLd included in the organic light emitting display panel 100, and a controller 400 which controls driving of the camera 500, the gate driver 200, and the data driver 300. In this case, a transparent area pixel driving circuit for driving a transparent area organic light emitting diode included in the transparent area AA1 may be provided in the buffer area AA2, and the transparent area organic light emitting diode may be connected to the transparent area pixel driving circuit through a transparent area electrode line.

The camera 500 may be provided between the external case 20 and the organic light emitting display panel 100 and may be driven based on control by the controller 400 or control by an external system 800 which controls driving of the electronic device. The camera 500, as illustrated in FIG. 3, may be provided in the rear surface of the organic light emitting display panel 100 and may perform a function of photographing a region in a forward direction with respect to the organic light emitting display panel 100 illustrated by an arrow in FIG. 3. Here, the forward direction with respect to the organic light emitting display panel 100 may denote a direction in which the organic light emitting display panel 100 displays an image.

The controller 400, as illustrated in FIG. 4, may include a data aligner 430 which realigns input video data Ri, Gi, and Bi transferred from the external system 800 by using a timing synchronization signal TSS transferred from the external system 800 to generate image data Data and supplies the image data Data to the data driver 300, a control signal generator 420 which generates a gate control signal GCS and a data control signal DCS by using the timing synchronization signal TSS, an input unit 410 which receives the timing synchronization signal TSS and the input video data Ri, Gi, and Bi from the external system 800, transfers the input video data Ri, Gi, and Bi to the data aligner 430, and transfers the timing synchronization signal TSS to the control signal generator 420, and an output unit 440 which outputs the image data Data generated by the data aligner 430 to the data driver 300, transfers the data control signal DCS generated by the control signal generator 420 to the data driver 300, and transfers the gate control signal GCS generated by the control signal generator 420 to the gate driver 200.

The gate driver 200 may be configured as an integrated circuit (IC), and then, may be mounted in the non-display area NAA or may be directly embedded into the non-display area NAA.

The data driver 300 may be included in a chip-on film 600 attached on the organic light emitting display panel 100. The chip-on film 600 may be connected to a main board 700 including the controller 400. In this case, a plurality of lines for electrically connecting the controller 400, the data driver 300, and the organic light emitting display panel 100 may be included in the chip-on film 600, and to this end, the lines may be electrically connected to a plurality of pads included in the organic light emitting display panel 100 and the main board 700. The main board 700 may be electrically connected to an external board 900 with the external system 800 mounted thereon. The data driver 300 may be directly mounted on the organic light emitting display panel 100 and may be electrically connected to the main board 700. Accordingly, an external configuration of the organic light emitting display apparatus 10 may be modified to have various shapes, in addition to a shape illustrated in FIG. 3.

The external system 800 may perform a function of driving the controller 400 and the electronic device. That is, when the electronic device is a smartphone, the external system 800 may receive various voice information, video information, and letter information over a wireless communication network and may transfer the video information to the controller 400. In the following description, the video information transferred from the external system 800 to the controller 400 may be referred to as input video data. Also, the external system 800 may execute an application for controlling the camera 500. The application may be downloaded to the external system 800 as an application (App) type, and then, may be executed by the external system 800.

The organic light emitting display panel 100 may include a plurality of pixels 110 which each include an organic light emitting diode and a pixel driving circuit for driving the organic light emitting diode. Also, the organic light emitting display panel 100 may include a plurality of signal lines which define a pixel area, where the pixels 110 are provided, and supply a driving signal to the pixel driving circuit.

The signal lines may include various kinds of lines, in addition to the gate lines GL1 to GLg and the data lines DL1 to DLd.

The organic light emitting display panel 100, as illustrated in FIGS. 1 and 2, may include the display area AA displaying an image and the non-display area NAA provided outside the display area AA.

The display area AA may include the transparent area AA1 where the camera 500 is disposed, the buffer area AA2 where the transparent area pixel driving circuits for driving the transparent area organic light emitting diodes included in the transparent area AA1 among the plurality of pixel driving circuits are provided, and the opaque area AA3 provided outside the buffer area AA2. That is, the opaque area AA3 may include all areas, except the transparent area AA1 and the buffer area AA2, of the display area AA.

The transparent area AA1 may be implemented to be transparent so that external light travels to the inside of the camera 500. That is, the transparent area AA1 may include a plurality of emission areas, where the transparent area organic light emitting diodes for displaying an image are provided, and a plurality of transmissive areas which are provided between the plurality of emission areas and transmit external light, which is incident through a front surface of the organic light emitting display panel 100, to the camera 500 disposed on the rear surface of the organic light emitting display panel 100. In this case, each of the emission areas may be implemented to transmit a portion of the external light.

The non-display area NAA may include a first non-display area NAA1 provided near an upper end of the organic light emitting display panel 100, a second non-display area NAA2 disposed to face the first non-display area NAA1 with the display area AA therebetween, a third non-display area provided between the first non-display area NAA1 and the second non-display area NAA2, and a fourth non-display area disposed to face the third non-display area with the display area AA therebetween.

A width of the non-display area NAA may be formed to be very small, and then, when the most of the non-display area NAA is covered by the external case 20, only the display area AA may be exposed at a front surface of the electronic device as illustrated in FIG. 1.

Figure 5:
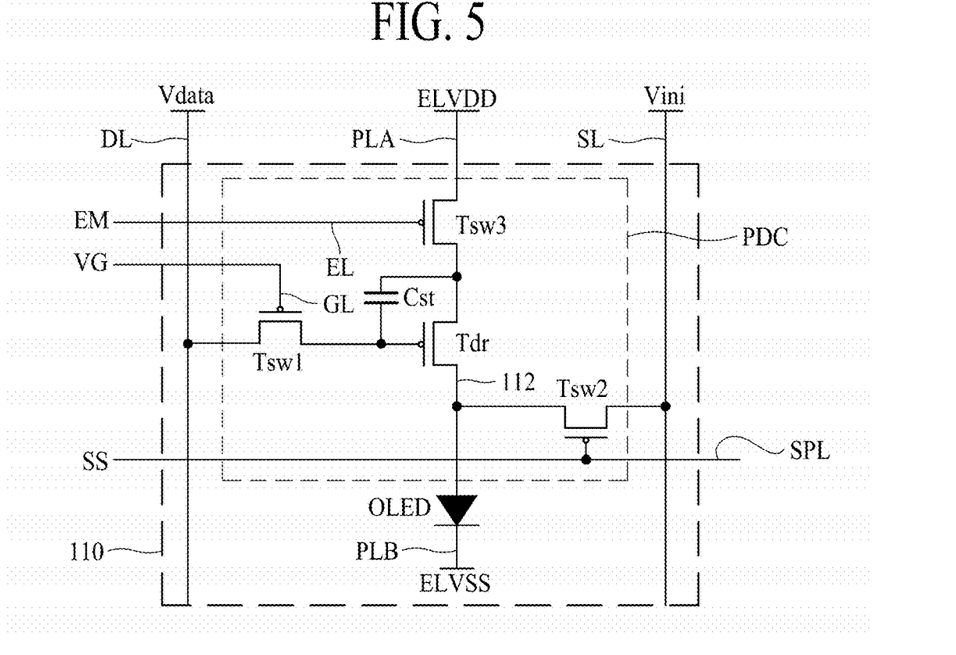
FIG. 5 is an exemplary diagram illustrating a structure of each pixel included in an organic light emitting display apparatus according to an embodiment of the present disclosure.

FIG. 5 is an exemplary diagram illustrating a structure of each pixel included in an organic light emitting display apparatus according to an embodiment of the present disclosure.

The display area AA1 of the organic light emitting display panel 100 may include a plurality of pixels 110 which includes an organic light emitting diode OLED and a pixel driving circuit PDC for driving the organic light emitting diode OLED. Also, the organic light emitting display panel 100 may include a plurality of signal lines which define a plurality of pixel areas, where the pixels 110 are respectively provided, and supply a driving signal to the pixel driving circuit PDC.

The signal lines may include a gate line GL, a data line DL, a sensing pulse line SPL, a sensing line SL, a first driving voltage line PLA, a second driving voltage line PLB, and an emission line EL.

A plurality of gate lines GL may be arranged at certain intervals in a second direction (for example, a widthwise direction) of the organic light emitting display panel 100.

A plurality of sensing pulse lines SPL may be arranged at certain intervals in parallel with the gate lines GL.

A plurality of data lines DL may be arranged at certain intervals in a first direction (for example, a lengthwise direction) of the organic light emitting display panel 100 to intersect with the gate lines GL and the sensing pulse lines SPL.

A plurality of sensing lines SL may be arranged at certain intervals in parallel with the data lines DL.

The first driving voltage line PLA may be provided apart from the data line DL and the sensing line SL by a certain interval in parallel with the data line DL and the sensing line SL. The first driving voltage line PLA may be connected to a power supply and may transfer a first driving voltage ELVDD, supplied from the power supply, to each pixel 110.

The second driving voltage line PLB may transfer a second driving voltage ELVSS, supplied from the power supply, to each of the pixels 110.

The emission lines EL may be arranged in parallel with the gate lines GL.

The pixel driving circuit PDC may include a driving transistor Tdr which controls the amount of current flowing in the organic light emitting diode OLED, a switching transistor Tsw1 which is connected between the data line DL, the driving transistor Tdr, and the gate line GL, and an emission transistor Tsw3 which controls a current flowing to the driving transistor Tdr. Also, the pixel driving circuit PDC may include a capacitor Cst and a sensing transistor Tsw2.

The switching transistor Tsw1 may be turned on by a gate pulse included in a gate signal transferred through the gate line GL and may output a data voltage Vdata, supplied through the data line DL, to a gate electrode of the driving transistor Tdr.

The sensing transistor Tsw2 may be turned on by a scan signal SS transferred through the sensing pulse line SPL and may transfer a sensing line voltage, supplied through the sensing line SL, to a source electrode of the driving transistor Tdr or may transfer a voltage, applied to the source electrode, to the sensing line SL.

The emission transistor Tsw3 may be turned on by an emission turn-on pulse included in an emission signal transferred through the emission line EL and may allow a current to flow to the organic light emitting diode OLED through the driving transistor Tdr, or may be turned off by an emission turn-off pulse included in the emission signal and may allow a current not to flow to the organic light emitting diode OLED.

The capacitor Cst may be provided between the gate electrode and the source electrode of the driving transistor Tdr and may be charged with the data voltage transferred through the switching transistor Tsw1, and the driving transistor Tdr may be driven based on a voltage charged into the capacitor Cst.

That is, the driving transistor Tdr may be turned on by the voltage charged into the capacitor Cst and may control the amount of data current flowing from the first driving power line PLA to the organic light emitting diode OLED.

The organic light emitting diode OLED may emit light with the data current supplied through the driving transistor Tdr to emit the light having luminance corresponding to the data current.

A structure of the pixel driving circuit PDC may be implemented as various structures, in addition to a structure illustrated in FIG. 5.

For example, in FIG. 5, it is illustrated that the transistors are formed as a P type and the pixel driving circuit PDC includes four transistors. However, the present disclosure is not limited thereto, and the pixel driving circuit PDC may include two transistors, three transistors, or five or more transistors.

That is, in order to compensate for a variation of a threshold voltage or mobility, caused by degradation, of the driving transistor Tdr, the pixel driving circuit PDC may further include at least one transistor, in addition to the sensing transistor Tsw2 and the driving transistor Tdr.

To provide an additional description, the pixel driving circuit PDC may include at least two transistors, for performing internal compensation or external compensation.

Here, the internal compensation may denote a method which controls a voltage at the gate electrode of the driving transistor Tdr so that a current supplied to the organic light emitting diode OLED is not affected by a variation of the threshold voltage or mobility of the driving transistor Tdr, despite a variation of the threshold voltage or mobility, caused by degradation, of the driving transistor Tdr.

The external compensation may denote a method which analyzes the amount of variation of the mobility or threshold voltage, caused by degradation, of the driving transistor Tdr and varies a level of the data voltage Vdata supplied through the data line DL on the basis of the amount of variation of the mobility or threshold voltage of the driving transistor Tdr.

Figure 6:
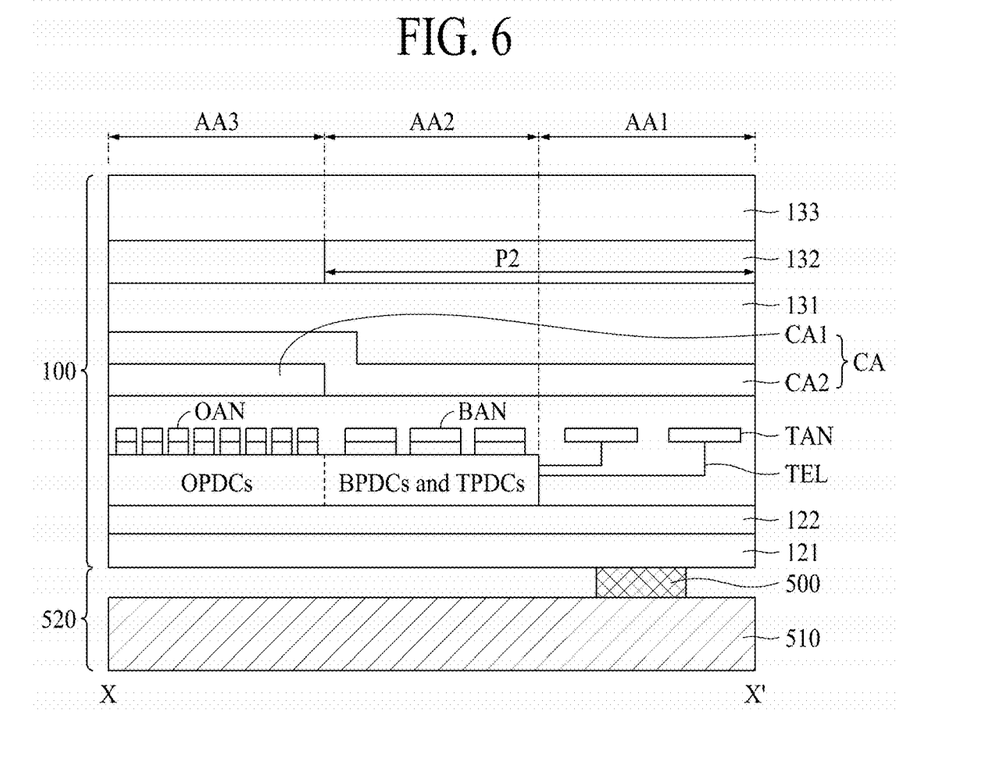
FIG. 6 is an exemplary diagram schematically illustrating a cross-sectional surface of an organic light emitting display panel applied to an organic light emitting display apparatus according to an embodiment of the present disclosure.
Figure 7:
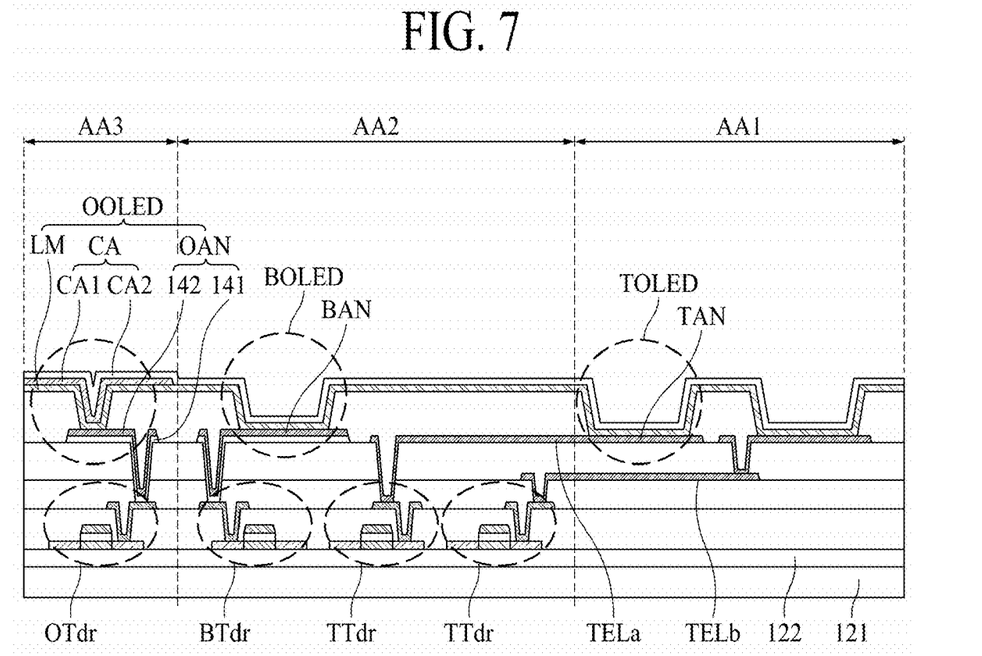
FIG. 7 is an exemplary diagram illustrating in detail a cross-sectional surface of an organic light emitting display panel applied to an organic light emitting display apparatus according to an embodiment of the present disclosure.

FIG. 6 is an exemplary diagram schematically illustrating a cross-sectional surface of an organic light emitting display panel applied to an organic light emitting display apparatus according to an embodiment of the present disclosure, and FIG. 7 is an exemplary diagram illustrating in detail a cross-sectional surface of an organic light emitting display panel applied to an organic light emitting display apparatus according to an embodiment of the present disclosure. Particularly, FIGS. 6 and 7 are exemplary diagrams illustrating a cross-sectional surface taken along line X-X' of a region K illustrated in FIG. 1.

In the following description, in the plurality of pixels 110, a pixel included in the transparent area AA1 may be referred to as a transparent area pixel, a pixel included in the buffer area AA2 may be referred to as a buffed area pixel, and a pixel included in the opaque area AA3 may be referred to as an opaque area pixel.

Moreover, in a plurality of organic light emitting diodes OLED, an organic light emitting diode included in the transparent area AA1 may be referred to as a transparent area organic light emitting diode TOLED, an organic light emitting diode included in the buffer area AA2 may be referred to as a buffer area organic light emitting diode BOLED, and an organic light emitting diode included in the opaque area AA3 may be referred to as an opaque area organic light emitting diode DOLED.

Moreover, in the pixel driving circuit PDC, a pixel driving circuit provided in the transparent area AA1 so as to drive the transparent area organic light emitting diode TOLED may be referred to as a transparent area pixel driving circuit TPDC, a pixel driving circuit provided in the buffer area AA2 so as to drive the buffer area organic light emitting diode BOLED may be referred to as a buffer area pixel driving circuit BPDC, and a pixel driving circuit provided in the opaque area AA3 so as to drive the opaque area organic light emitting diode DOLED may be referred to as an opaque area pixel driving circuit OPDC.

Moreover, a line connecting the transparent area organic light emitting diode TOLED to the transparent area pixel driving circuit TPDC may be referred to as a transparent area electrode line TEL, a line connecting the buffer area organic light emitting diode BOLED to the buffer area pixel driving circuit BPDC may be referred to as a buffer area electrode line, and a line connecting the opaque area organic light emitting diode DOLED to the opaque area pixel driving circuit OPDC may be referred to as an opaque area electrode line.

For example, as illustrated in FIG. 6, an organic light emitting display apparatus according to the present disclosure may include a camera part 520, including a camera 500 and a camera board 510, and the organic light emitting display panel 100. The camera part 520 may be provided on a rear surface of the organic light emitting display panel 100, and particularly, the camera 500 may be disposed at a position corresponding to the transparent area AA1.

The organic light emitting display panel 100, as illustrated in FIGS. 6 and 7, may include a substrate 121, a buffer 122 provided on the substrate 121, a plurality of transparent area pixel driving circuits TPDC provided at an upper end of the buffer 122, a plurality of buffer area pixel driving circuits BPDC provided at the upper end of the buffer 122, a plurality of opaque area pixel driving circuits OPDC provided at the upper end of the buffer 122, a transparent area anode TAN provided at an upper end of each of the plurality of transparent area pixel driving circuits TPDC, a buffer area anode BAN provided at an upper end of each of the plurality of buffer area pixel driving circuits BPDC, an opaque area anode OAN provided at an upper end of each of the plurality of opaque area pixel driving circuits OPDC, a transparent area light emitting material provided at an upper end of the transparent area anode TAN, a buffer area light emitting material provided at an upper end of the buffer area anode BAN, an opaque area light emitting material provided at an upper end of the opaque area anode OAN, a cathode CA provided at an upper end of each of the light emitting materials LM, a passivation layer 131 provided at an upper end of the cathode CA, a polarizer 132 provided at an upper end of the passivation layer 131, and a cover glass 133 provided at an upper end of the polarizer 132.

The buffer 122 and the polarizer 132 may be omitted.

A portion P2, corresponding to the transparent area AA1 and the buffer area AA2, of the polarizer 132 may be omitted for enhancing a transmittance. That is, the portion P2, corresponding to the transparent area AA1 and the buffer area AA2, of the polarizer 132 may be cut by a puncher, or may not be deposited in a process of depositing a polarizer.

A driving transistor Tdr included in the transparent area pixel driving circuit TPDC may be referred to as a transparent area driving transistor TTdr, a driving transistor Tdr included in the buffer area pixel driving circuit BPDC may be referred to as a buffer area driving transistor BTdr, and a driving transistor Tdr included in the opaque area pixel driving circuit OPDC may be referred to as an opaque area driving transistor OTdr.

The transparent area driving transistor TTdr and the buffer area driving transistor BTdr may be provided in the buffer area AA2, and the opaque area driving transistor OTdr may be provided in the opaque area AA3.

The opaque area anode OAN connected to the opaque area pixel driving circuit OPDC may include a double layer which includes a reflective electrode 141 such as silver (Ag) and a transparent metal 142 such as indium tin oxide (ITO).

Also, the buffer area anode BAN may include a double layer which includes a reflective electrode 141 such as Ag and a transparent metal 142.

The transparent area anode TAN may be electrically connected to the transparent area electrode line TEL, and in order to increase a transmittance of the transparent area AA1, for example, the transparent area anode TAN may include a transparent metal 142 such as ITO. In this case, the transparent area electrode line TEL may include only the transparent metal 142.

As illustrated in FIGS. 6 and 7, a plurality of transparent area electrode lines TEL and a plurality of transparent area anodes TAN may be provided in the transparent area AA1. That is, the transparent area electrode lines TEL and a plurality of transparent area organic light emitting diodes TOLED may be provided in the transparent area AA1. In FIG. 7, in order to differentiate two transparent area electrode lines, the transparent area electrode lines are referred to by reference numerals TELa and TELb.

A plurality of buffer area organic light emitting diodes BOLED, a plurality of buffer area pixel driving circuits BPDC for driving the buffer area organic light emitting diodes BOLED, and a plurality of transparent area pixel driving circuits TPDC may be provided in the buffer area AA2. That is, the plurality of transparent area driving transistors TTdr included in the transparent area pixel driving circuits TPDC and the plurality of buffer area driving transistors BTdr and the plurality of buffer area organic light emitting diodes BOLED included in the buffer area pixel driving circuits BPDC may be provided in the buffer area AA2.

The opaque area organic light emitting diodes OOLED and the opaque area pixel driving circuits OPDC may be provided in the opaque area AA3. That is, the opaque area driving transistors OTdr and the opaque area organic light emitting diodes OOLED may be provided in the opaque area AA3.

The cathode CA may include an opaque metal CA1 such as magnesium (Mg) or Ag and a transparent metal CA2 such as indium zinc oxide (IZO).

In this case, in order to increase a transmittance of the transparent area AA1, a cathode CA provided in the transparent area AA1 may include only a transparent metal CA2 such as IZO. Also, a cathode CA provided in the buffer area AA2 may include only a transparent metal CA2 such as IZO. However, a cathode CA provided in the opaque area AA3 may be formed of a double layer which includes the opaque metal CA1 and the transparent metal CA2.

Figure 8:
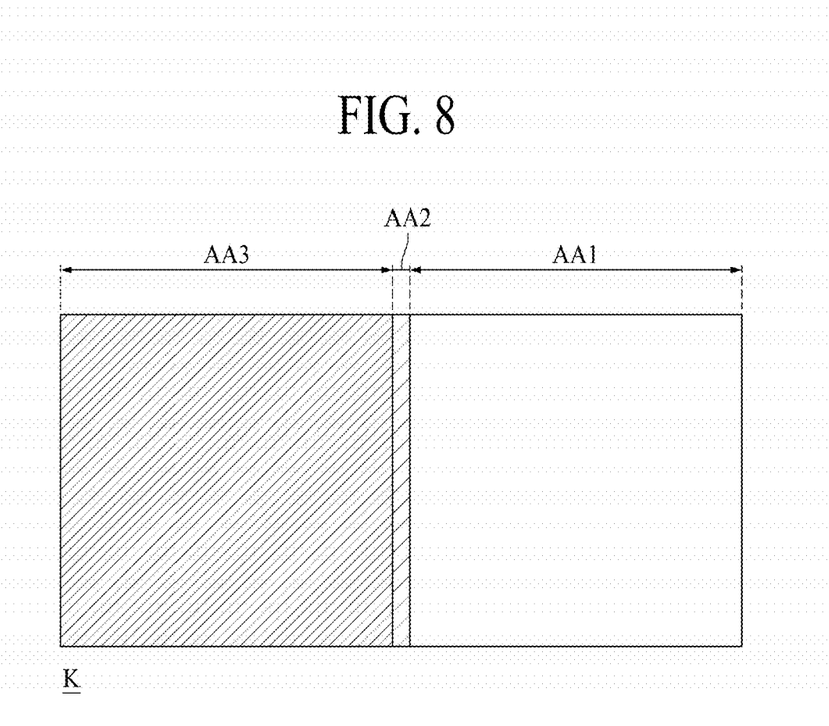
FIG. 8 is a plan view schematically illustrating a region K illustrated in FIGS. 1 and 3.
Figure 9:
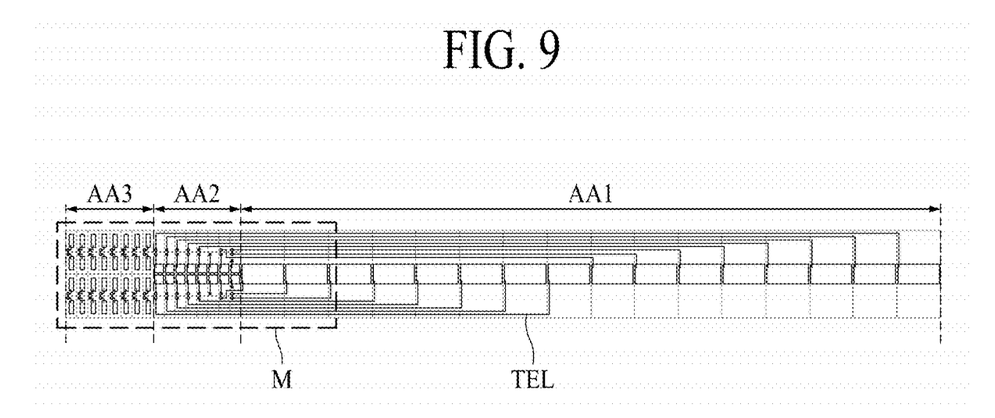
FIG. 9 is an exemplary diagram illustrating a plurality of pixel driving circuits provided in a region K illustrated in FIG. 8.
Figure 10:
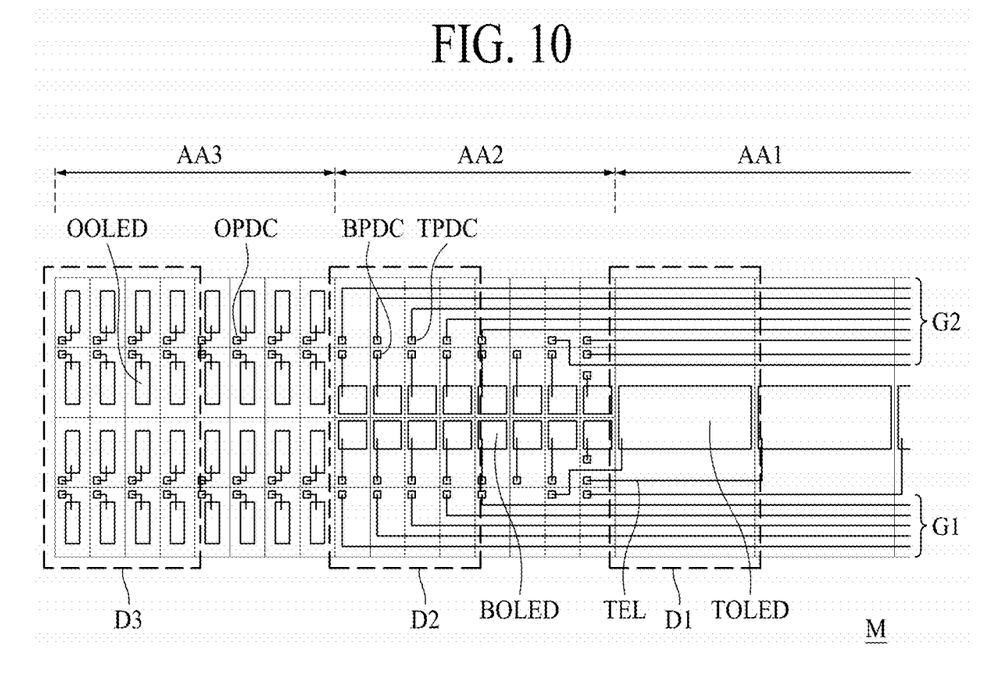
FIG. 10 is an exemplary diagram illustrating the enlargement of a region M illustrated in FIG. 9.

FIG. 8 is a plan view schematically illustrating a region K illustrated in FIGS. 1 and 3, FIG. 9 is an exemplary diagram illustrating a plurality of pixel driving circuits provided in a region K illustrated in FIG. 8, and FIG. 10 is an exemplary diagram illustrating the enlargement of a region M illustrated in FIG. 9.

As described above, the display area AA may include the transparent area AA1, the buffer area AA2 provided outside the transparent area AA1, and the opaque area AA3 provided outside the buffer area AA2, and the camera 500 for photographing a region in a forward direction with respect to the organic light emitting display panel 100 may be provided in the transparent area AA1 in the rear surface of the organic light emitting display panel 100. In this case, the transparent area pixel driving circuit TPDC for driving the transparent area organic light emitting diode TOLED provided in the transparent area AA1 may be provided in the buffer area AA2, and the transparent area pixel driving circuit TPDC may be connected to the transparent area organic light emitting diode TOLED through the transparent area electrode line TEL. In the following description, description which is the same as or similar to description given above with reference to FIGS. 1 to 7 is omitted or will be briefly given.

The transparent area anode TAN included in each of the transparent area organic light emitting diodes TOLED, as described above, may include only the transparent metal 142, and the cathode CA included in each of the transparent area organic light emitting diodes TOLED may include only the transparent metal CA2. Also, only the transparent area organic light emitting diodes TOLED and the transparent area electrode lines TEL may be provided in the transparent area AA1.

Therefore, a transmittance of the transparent area AA1 may more increase than that of each of the buffer area AA2 and the opaque area AA3.

A density of the buffer area organic light emitting diodes BOLED provided in the buffer area AA2 may be higher than a density of the transparent area organic light emitting diodes TOLED provided in the transparent area AA1. Also, a density of the opaque area organic light emitting diodes OOLED provided in the opaque area AA3 may be higher than a density of the buffer area organic light emitting diodes BOLED provided in the buffer area AA2.

For example, in the organic light emitting display panel illustrated in FIGS. 9 and 10, a first region D1 of the transparent area AA1, a second region D2 of the buffer area AA2, and a third region D3 of the opaque area AA3 may have the same area.

In this case, one transparent area organic light emitting diode TOLED may be provided in the first region D1, eight buffer area organic light emitting diodes BOLED may be provided in the second region D2, and sixteen opaque area organic light emitting diode OOLED may be provided in the third region D3. Accordingly, a relationship may be formed where a density of the buffer area organic light emitting diodes BOLED is higher than a density of the transparent area organic light emitting diodes TOLED and a density of the opaque area organic light emitting diodes OOLED is higher than a density of the buffer area organic light emitting diodes BOLED.

A density difference described above may be variously changed based on the number of buffer area organic light emitting diodes BOLED, the number of transparent area pixel driving circuits TPDC provided in the buffer area AA2, and an area of the transparent area AA1.

In this case, a size of each of the transparent area organic light emitting diodes TOLED may be set to be greater than that of each of the opaque area organic light emitting diodes OOLED provided in the opaque area.

That is, as described above, because a density of the transparent area organic light emitting diodes TOLED is lower than a density of the opaque area organic light emitting diodes BOLED, a luminance of the transparent area AA1 may be lower than that of the opaque area AA3. In order to compensate for a luminance difference, a size of each of the transparent area organic light emitting diodes TOLED may be set to be greater than that of each of the opaque area organic light emitting diodes OOLED.

Moreover, for this reason described above, a size of each of the buffer area organic light emitting diodes BOLED may be set to be greater than that of each of the opaque area organic light emitting diodes OOLED. In this case, a size of each of the buffer area organic light emitting diodes BOLED may be set to be less than that of each of the transparent area organic light emitting diodes TOLED.

At least two of the transparent area electrode lines TEL connecting the transparent area pixel driving circuits TPDC to the transparent area organic light emitting diodes TOLED may be provided on different layers with an insulation layer therebetween.

For example, in FIG. 7, an organic light emitting display panel where two transparent area electrode lines TELa and TELb are provided on different layers is illustrated. In this case, in FIG. 7, one transparent area electrode line may be provided on each layer, but the present disclosure is not limited thereto and two transparent area electrode lines may be provided on each layer.

That is, at least two of the transparent area electrode lines TEL connecting the transparent area pixel driving circuits TPDC to the transparent area organic light emitting diodes TOLED may be disposed apart from each other on the same layer.

For example, in a plan view illustrated in FIG. 9, when the transparent area electrode lines TEL are provided on the same layer, the transparent area electrode lines TEL may be disposed apart from one another on the same layer.

To provide an additional description, in FIG. 9, at least two transparent area electrode lines TEL may be provided on different layers as illustrated in FIG. 7, and when at least two transparent area electrode lines TEL are provided on the same layer, the transparent area electrode lines TEL may be disposed apart from one another on the same layer.

The transparent area electrode lines TEL connecting the transparent area pixel driving circuits TPDC to the transparent area organic light emitting diodes TOLED, as illustrated in FIGS. 9 and 10, may extend in a direction from the buffer area AA2 to the transparent area AA1. The transparent area organic light emitting diodes TOLED provided in the transparent area AA1 may be disposed in a direction parallel to the transparent area electrode lines TEL.

In this case, in the plurality of transparent area electrode lines TEL, first to $n^{th}$ (where n is an integer of 2 or more) transparent area electrode lines TEL connected to first to $n^{th}$ transparent area organic light emitting diodes TOLED disposed along the transparent area electrode lines TEL from an adjacent region adjacent to the buffer area AA2 may be provided at first sides of the first to $n^{th}$ transparent area organic light emitting diodes TOLED, and $n+1^{th}$ to $2n^{th}$ transparent area electrode lines TEL connected to $n+1^{th}$ to $2n^{th}$ transparent area organic light emitting diodes TOLED may be provided at second sides of first to $2n^{th}$ transparent area organic light emitting diodes TOLED.

For example, when n is eight, as illustrated in FIGS. 9 and 10, sixteen (2n) transparent area organic light emitting diodes TOLED may be disposed in one row along the transparent area electrode lines TEL from the adjacent region.

In this case, first to eighth transparent area electrode lines connected to first to eighth transparent area organic light emitting diodes TOLED may configure a first group G1 and may be provided at first sides of the first to eighth transparent area organic light emitting diodes TOLED.

Moreover, ninth to sixteenth transparent area electrode lines connected to ninth to sixteenth transparent area organic light emitting diodes TOLED may configure a second group G2 and may be provided at second sides of the first to sixteenth transparent area organic light emitting diodes TOLED. In FIGS. 9 and 10, the first sides may denote upper ends of the first to sixteenth transparent area organic light emitting diodes TOLED, and the second sides may denote lower ends of the first to sixteenth transparent area organic light emitting diodes TOLED.

As described above, when a same or similar number of transparent area electrode lines TEL are provided at both sides of the transparent area organic light emitting diodes TOLED, a luminance difference between the both sides of the transparent area organic light emitting diodes TOLED may be reduced, and the arrangement of the transparent area electrode lines TEL may be more easy. That is, based on an arrangement structure described above, the number of adjacent transparent area electrode lines TEL provided on the same layer and the number of transparent area electrode lines TEL provided on different layers may be reduced, and thus, the transparent area electrode lines TEL may be uniformly distributed on the same layer and different layers, thereby preventing short circuit between the transparent area electrode lines TEL.

As a length of each of the first to $2n^{th}$ transparent area electrode lines TEL increases, a thickness of each of the first to $2n^{th}$ transparent area electrode lines TEL may progressively increase.

That is, as a length of each of the transparent area electrode lines TEL increases, a resistance of each of the transparent area electrode lines TEL may increase, and thus, a voltage or a current transferred through each of the transparent area electrode lines TEL may decrease. Also, when resistances of the transparent area electrode lines TEL differ, intensities of lights emitted from the transparent area organic light emitting diodes TOLED by the same current and voltage may differ.

In order to solve such a problem, in the present disclosure, as illustrated in FIG. 9, as a length of each of the first to $2n^{th}$ transparent area electrode lines TEL increases, a thickness of each of the first to $2n^{th}$ transparent area electrode lines TEL may progressively increase. Accordingly, resistances of the first to $2n^{th}$ transparent area electrode lines TEL may be maintained to be equal or similar to one another, and thus, a luminance difference between the transparent area organic light emitting diodes TOLED may be reduced.

Figure 11:
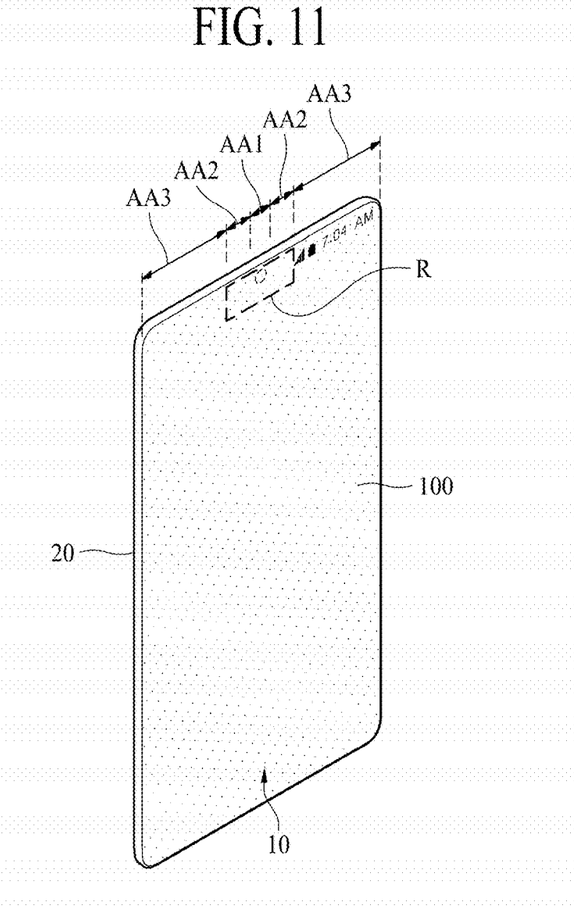
FIG. 11 is another exemplary diagram illustrating an external configuration of an electronic device to which an organic light emitting display apparatus according to an embodiment of the present disclosure is applied.
Figure 12:
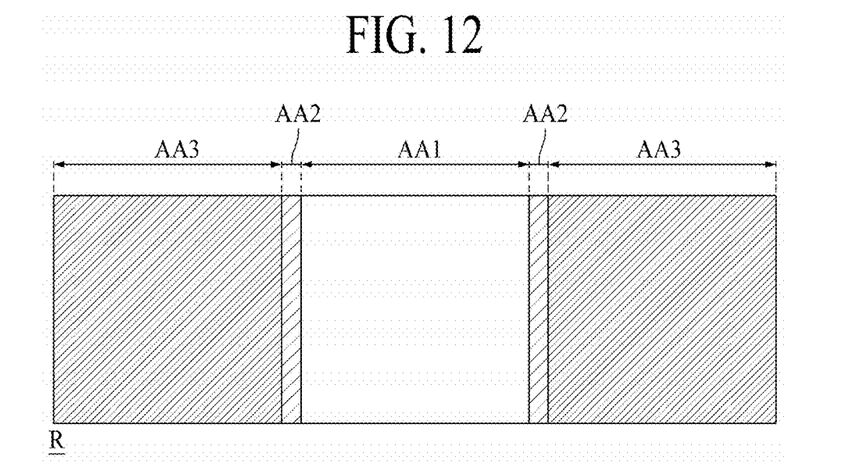
FIG. 12 is a plan view schematically illustrating a region R illustrated in FIG. 11.

FIG. 11 is another exemplary diagram illustrating an external configuration of an electronic device to which an organic light emitting display apparatus according to an embodiment of the present disclosure is applied, and FIG. 12 is a plan view schematically illustrating a region R illustrated in FIG. 11.

In the present disclosure, as illustrated in FIGS. 1 to 10, the buffer area AA2 may be provided at one side of the transparent area AA1, and the opaque area AA3 may be provided in a direction opposite to the transparent area AA1 with the buffer area AA2 therebetween.

However, in the present disclosure, as illustrated in FIGS. 11 and 12, the transparent area AA1 may be provided between two buffer areas AA2, and a plurality of opaque areas AA3 may be respectively provided outside the two buffer areas AA2.

That is, an arrangement relationship between the transparent area AA1, the buffer area AA2, and the opaque area AA3 may be variously changed.

However, structures and a connection relationship of the transparent area AA1, the buffer area AA2, and the opaque area AA3 described above with reference to FIGS. 1 to 10 may be identically applied to the transparent area AA1, the buffer area AA2, and the opaque area AA3 illustrated in FIGS. 11 and 12.

Features of the present disclosure described above will be briefly described below.

In order to increase a transmittance of the transparent area AA1, the transparent area anode TAN may include only a transparent metal 142, and moreover, the transparent area electrode line TEL may include a transparent metal. In this case, a driving signal supplied to the transparent area anode TAN may be supplied through the transparent area electrode line TEL from the transparent area pixel driving circuit TPDC provided outside the transparent area AA1 (i.e., provided in the buffer area AA2).

A cathode provided in the transparent area AA1 may also include a transparent metal C2 such as IZO.

When a density (pixel per inch (PPI)) of the opaque area pixels (or the opaque area organic light emitting diodes DOLED) of the opaque area AA3 is 400 ppi, a density (PPI) of the opaque area pixels (or the opaque area organic light emitting diodes DOLED) of the transparent area AA1 may be set to 100 ppi to 200 ppi. Accordingly, a transmittance of the transparent area AA1 may increase.

That is, a transparency of the transparent area AA1 may be higher than that of the opaque area AA3, but a resolution of the transparent area AA1 may be higher than that of the opaque area AA3. A transparency of the buffer area AA2 may be equal to or less than a medium transparency of transparencies of the transparent area AA1 and the opaque area AA3, but a resolution of the buffer area AA2 may be equal to or less than a medium resolution of resolutions of the transparent area AA1 and the opaque area AA3.

The transparent area organic light emitting diodes TOLED and the transparent area electrode lines TEL may be provided in the transparent area AA1, and the transparent area pixel driving circuits TPDC connected to the transparent area electrode lines TEL may be provided in the buffer area AA2. Also, the transparent area electrode lines TEL may include a transparent metal. Accordingly, comparing with the related art, a transmittance of the transparent area AA1 may be enhanced.

The pixel driving circuits (i.e., the buffer area pixel driving circuits BPDC and the transparent area pixel driving circuits TPDC) may be provided in the buffer area AA2 to maintain a high resolution of the opaque area AA3. A resolution of each of the organic light emitting diodes (i.e., the buffer area organic light emitting diodes BOLED) provided in the buffer area AA2 may be lower than that of the opaque area AA3.

Therefore, according to the present disclosure described above, a resolution of the transparent area AA1 may differ from that of the opaque area AA3, and a resolution of the opaque area AA3 may be relatively enhanced.

In this case, because the transparent area pixel driving circuit TPDC is not provided in the transparent area AA1, a transmittance of the transparent area AA1 may be maximized.

A line width of each of the transparent area electrode lines TEL may be differently set based on a length thereof. That is, the line width of each of the transparent area electrode lines TEL may be differently set for preventing a resistance variation between lines caused by a length difference between the transparent area electrode lines TEL.

For example, Table 1 shows a resistance difference between the transparent area electrode lines TEL and the degree of voltage drop caused thereby in Case1 where the line widths of the transparent area electrode lines TEL are the same and in Case2 where the line widths of the transparent area electrode lines TEL are differently set based on lengths of the transparent area electrode lines TEL like the present disclosure.

That is, in Case1 where the line widths of the transparent area electrode lines TEL are the same, a resistance difference of a maximum of about 10 MΩ may occur, and a voltage difference of a maximum of about 50 mV may occur in voltage drop.

On the other hand, like the present disclosure, in Case2 where the line widths of the transparent area electrode lines TEL are differently set, a resistance difference of a maximum of about 50 MΩ may occur, and a voltage difference of a maximum of about 25 mV may occur in voltage drop.

Therefore, when the line widths of the transparent area electrode lines TEL are differently set like the present disclosure, it may be seen that a resistance difference and a voltage drop difference between the transparent area electrode lines TEL are reduced.

pixel driving circuits for driving a plurality of transparent area organic light emitting diodes included in the transparent area may be provided in a buffer area disposed outside the transparent area. Accordingly, a transmittance of the transparent area may increase.

That is, in the organic light emitting display panel applied to the present disclosure, an opaque area provided outside the buffer area may be formed in the same shape as that of a related art organic light emitting display panel, the transparent area may include a transparent panel including only the transparent area organic light emitting diodes, and the transparent area pixel driving circuits for driving the transparent area organic light emitting diodes may be provided in the buffer area disposed between the opaque area and the transparent area.

Therefore, according to the present disclosure, a resolution of the organic light emitting display panel may be

TABLE 1

| | anode line length | 0~10% | 10~20% | 20~30% | 30~40% | 40~50% | 50~60% | 60~70% | 70~80% | 80~90% | 90~100% | MAX |
|---|---|---|---|---|---|---|---|---|---|---|---|---|
| Case 1 | line width | | | | | | 5 μm | | | | | — |
| | Resistance [MΩ] | 0~1 | 1~2 | 2~3 | 3~4 | 4~5 | 5~6 | 6~7 | 7~8 | 8~9 | 9~10 | 10 |
| | $V_{DROP}$ [mV] | 0~5 | 5~10 | 10~15 | 15~20 | 20~25 | 25~30 | 30~35 | 35~40 | 40~45 | 45~50 | 50 |
| Case 2 | line width | 1 μm | 2 μm | 3 μm | 4 μm | 5 μm | 6 μm | 7 μm | 8 μm | 9 μm | 10 μm | — |
| | Resistance [MΩ] | 0~5 | 25~5 | 3.33~5 | 3.75~5 | 4~5 | 4.17~5 | 4.29~5 | 4.38~5 | 4.44~5 | 4.5~5 | 5 |
| | $V_{DROP}$ [MV] | 0~25 | 12.5~25 | 16.7~25 | 18.8~25 | 20~25 | 20.8~25 | 21.4~25 | 21.9~25 | 22.2~25 | 22.5~25 | 25 |

The transparent area anode TAN and the cathode in the transparent area AA1 may include transparent metals 142 and CA2. Therefore, at a timing at which the transparent area organic light emitting diodes TOLED emit lights, light may be output in a direction toward the camera 500. Accordingly, the present disclosure may use the following methods.

That is, in a non-driving period where the camera 500 is not driven, the transparent area organic light emitting diodes TOLED, the buffer area organic light emitting diodes BOLED, and the opaque area organic light emitting diodes DOLED may be driven based on a normal method.

In a camera driving period where the camera 500 is driven, the controller 400 may receive a signal, representing the start of driving of the camera 500, from the external system 800.

In this case, the controller 400 may drive the buffer area AA2 and the opaque area AA3 on the basis of the normal method regardless of driving of the camera 500.

However, the controller 400 may provide the transparent area pixel driving circuits TPDC with signals which allow a gray level "0" to be output. Accordingly, the transparent area organic light emitting diodes TOLED may emit lights corresponding to a black image.

When the camera driving period ends, the controller 400 may receive a signal, representing the end of driving of the camera 500, from the external system 800.

In this case, the controller 400 may again drive the transparent area organic light emitting diodes TOLED, the buffer area organic light emitting diodes BOLED, and the opaque area organic light emitting diodes OOLED on the basis of the normal method.

According to the present disclosure, a transparent panel may be provided in a transparent area corresponding to a region, where a camera is disposed, of an organic light emitting display panel, and a plurality of transparent area maintained to be equal to that of the related art organic light emitting display panel, and a transmittance of the transparent area may be maximized.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the organic light emitting display apparatus of the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus, comprising:
    an organic light emitting display panel including a display area and a non-display area, the display area including a transparent area, a buffer area provided outside the transparent area, and an opaque area provided outside the buffer area;
    a camera provided in the transparent area in a rear surface of the organic light emitting display panel to photograph a region in a forward direction with respect to the organic light emitting display panel;
    a plurality of transparent area organic light emitting diodes provided in the transparent area, including first, second, and third transparent organic light emitting diodes disposed increasingly farther away from the buffer area along a first direction away from the buffer area, wherein each of the plurality of transparent area organic light emitting diodes comprises a cathode including only a transparent metal;

a buffer area organic light emitting diode provided in the buffer area and comprising a cathode including only a transparent metal; and an opaque area organic light emitting diode provided in the opaque area and comprising a cathode including an opaque metal;

a plurality of transparent area pixel driving circuits to drive the plurality of transparent area organic light emitting diodes, respectively, the plurality of transparent area pixel driving circuits including a first transparent area pixel driving circuit provided in the buffer area to drive the first transparent area organic light emitting diode, a second transparent area pixel driving circuit provided in the buffer area to drive the second transparent area organic light emitting diode, and a third transparent area pixel driving circuit provided in the buffer area to drive the third transparent area organic light emitting diode; and a plurality of transparent area electrode lines extending from the buffer area to the transparent area in the first direction, the transparent area electrode lines including first, second, and third transparent area electrode lines, wherein the first, second, and third transparent area organic light emitting diodes are connected to the first, second, and third transparent area pixel driving circuits through the first, second, and third transparent area electrode lines, respectively.

2. The organic light emitting display apparatus of claim 1, further comprising:
   a plurality of buffer area organic light emitting diodes provided in the buffer area, including the buffer area organic light emitting diode, and having a density higher than a density of the plurality of transparent area organic light emitting diodes provided in the transparent area, and
   a plurality of opaque area organic light emitting diodes provided in the opaque area including the opaque area organic light emitting diode, and having a density higher than the density of the plurality of buffer area organic light emitting diodes provided in the buffer area.

3. The organic light emitting display apparatus of claim 1, further comprising:
   a plurality of buffer area organic light emitting diodes provided in the buffer area, including the buffer area organic light emitting diode; and
   a plurality of buffer area pixel driving circuits provided in the buffer area to drive the plurality of buffer area organic light emitting diodes.

4. The organic light emitting display apparatus of claim 1, wherein the first and second transparent area electrode lines are provided on different layers with an insulation layer therebetween.

5. The organic light emitting display apparatus of claim 1, wherein at least two of the plurality of transparent area electrode lines are disposed apart from each other on the same layer.

6. The organic light emitting display apparatus of claim 1, wherein a size of each of the plurality of transparent area organic light emitting diodes is greater than a size of each of a plurality of opaque area organic light emitting diodes provided in the opaque area.

7. The organic light emitting display apparatus of claim 1, wherein the plurality of transparent area organic light emitting diodes provided in the transparent area are disposed in a direction parallel to the plurality of transparent area electrode lines.

8. The organic light emitting display apparatus of claim 7, wherein, among the plurality of transparent area electrode lines, the first to $n^{th}$ transparent area electrode lines are connected respectively to first sides of the first to $n^{th}$ transparent area organic light emitting diodes disposed along the first direction away from the buffer area, and $(n+1)^{th}$ to $2n^{th}$ transparent area electrode lines are connected respectively to second sides of the $(n+1)^{th}$ to $2n^{th}$ transparent area organic light emitting diodes disposed along the first direction away from the buffer area, where n is an integer of 2 or more.

9. The organic light emitting display apparatus of claim 8, wherein, as a length of each of the first to the $2n^{th}$ transparent area electrode lines increases, a thickness of each of the first to the $2n^{th}$ transparent area electrode lines increases.

10. The organic light emitting display apparatus of claim 1, wherein:
    the opaque area organic light emitting diode provided in the opaque area comprises the cathode having a double layer which includes the opaque metal and a transparent metal.

11. The organic light emitting display apparatus of claim 1, wherein:
    a size of the first transparent area organic light emitting diode is greater than a size of the opaque area organic light emitting diode provided in the opaque area, and
    a size of the buffer area organic light emitting diode provided in the buffer area is smaller than the size of the first transparent area organic light emitting diode and is greater than the size of the opaque area organic light emitting diode.

12. The organic light emitting display apparatus of claim 1, wherein the transparent area is provided between the buffer area and another buffer area which are provided between the opaque area and another opaque area.

13. The organic light emitting display apparatus of claim 1, wherein the cathode of the opaque area organic light emitting diode further includes a transparent metal.

14. The organic light emitting display apparatus of claim 1, wherein each of the plurality of transparent area pixel driving circuits is disposed outside the transparent area.

15. The organic light emitting display apparatus of claim 1, wherein none of the plurality of transparent area pixel driving circuits is disposed in the transparent area.

* * * * *